United States Patent [19]

Nishioka et al.

[11] Patent Number: 5,038,186
[45] Date of Patent: Aug. 6, 1991

[54] LIGHT EMITTING DIODE ARRAY

[75] Inventors: Takafumi Nishioka; Shigeo Tsuda, both of Fukuyama, Japan

[73] Assignee: Mitsubishi Denki Kabushiki Kaisha, Tokyo, Japan

[21] Appl. No.: 513,848

[22] Filed: Apr. 24, 1990

[51] Int. Cl.$^5$ .......................................... H01L 33/00
[52] U.S. Cl. ...................................... 357/17; 357/30; 357/32; 357/68
[58] Field of Search ............... 357/17, 30 L, 32, 30 P, 357/30 H, 30 D, 68, 55; 362/800; 313/500; 340/762

[56] References Cited

U.S. PATENT DOCUMENTS 4,801,994 1/1989 Van Gorkom et al. ............... 357/17

FOREIGN PATENT DOCUMENTS

| 58-223382 | 12/1983 | Japan | 357/17 |
| 60-37575 | 2/1985 | Japan | 357/17 |
| 61-40068 | 2/1986 | Japan | 357/17 |
| 61-95956 | 5/1986 | Japan | 357/17 |
| 61-207086 | 9/1986 | Japan | 357/17 |
| 63-56967 | 3/1988 | Japan | 357/17 |
| 1-128480 | 5/1989 | Japan | 357/17 |

OTHER PUBLICATIONS

Marinace, "Electroluminescent Diode", IBM Technical Disclosure Bulletin, vol. 11, No. 11, 4/1969.
Berkenblit et al., "Fabricating Light Emitting Diodes", IBM Technical Disclosure Bulletin, vol. 13, No. 6, 11/70.
Eisenmann et al., "Polymer Field Stop for Electrooptic Device", IBM Tech. Disc. Bull., vol. 17, No. 3, 8/74.

Primary Examiner—Rolf Hille
Assistant Examiner—Minhloan Tran
Attorney, Agent, or Firm—Oblon, Spivak, McClelland, Maier & Neustadt

[57] ABSTRACT

In an LED array (100), opaque layer (38) is provided on a semiconductor body (30) having PN junctions (41). A through holes (40) having a relatively small diameter are formed in the opaque layer on the PN junctions. Light which is generated at the PN junctions is emitted only through the holes in the form of photobeams. The LED array can be used in an electronic printer for photography without a self-focus lens array.

3 Claims, 8 Drawing Sheets

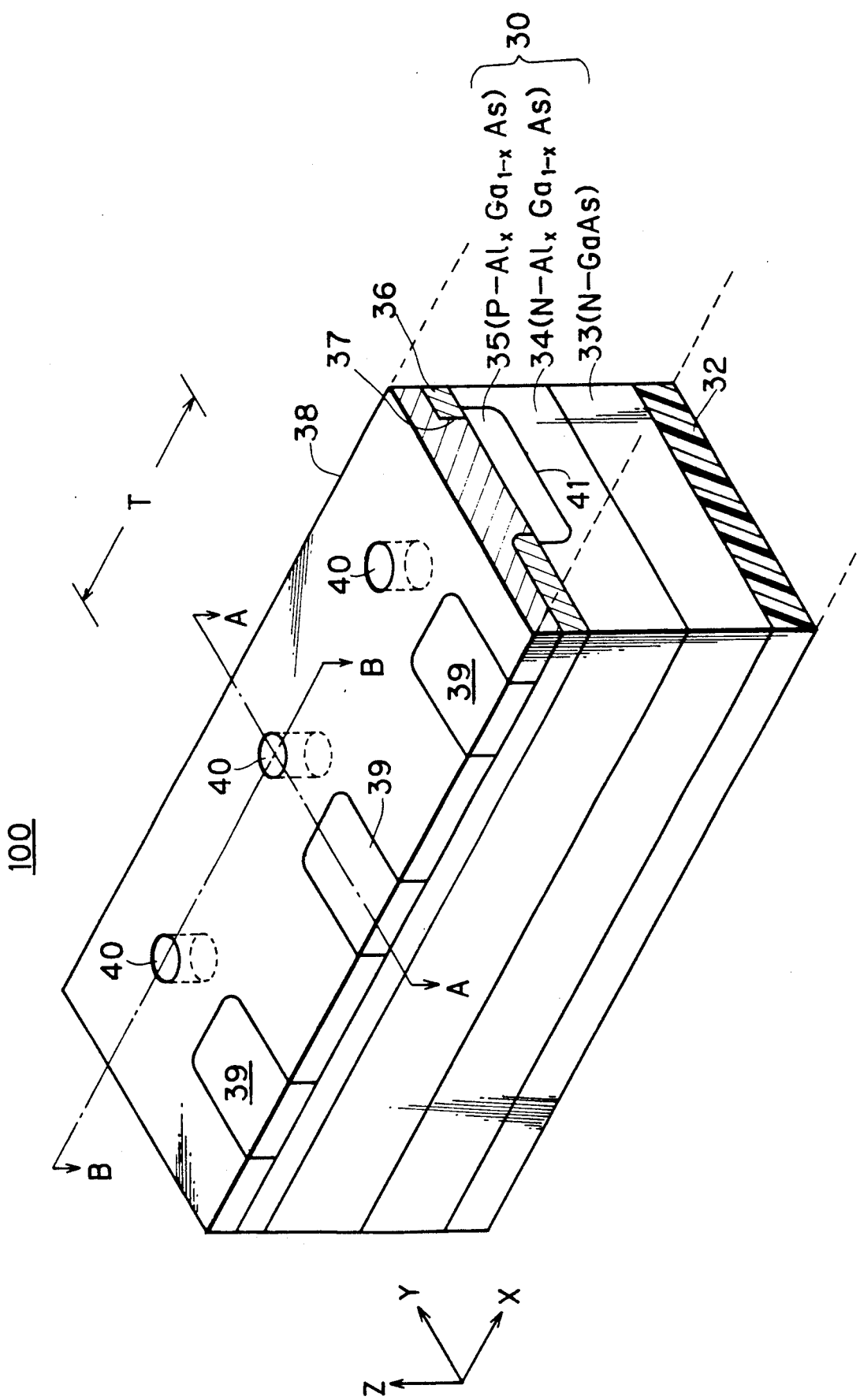

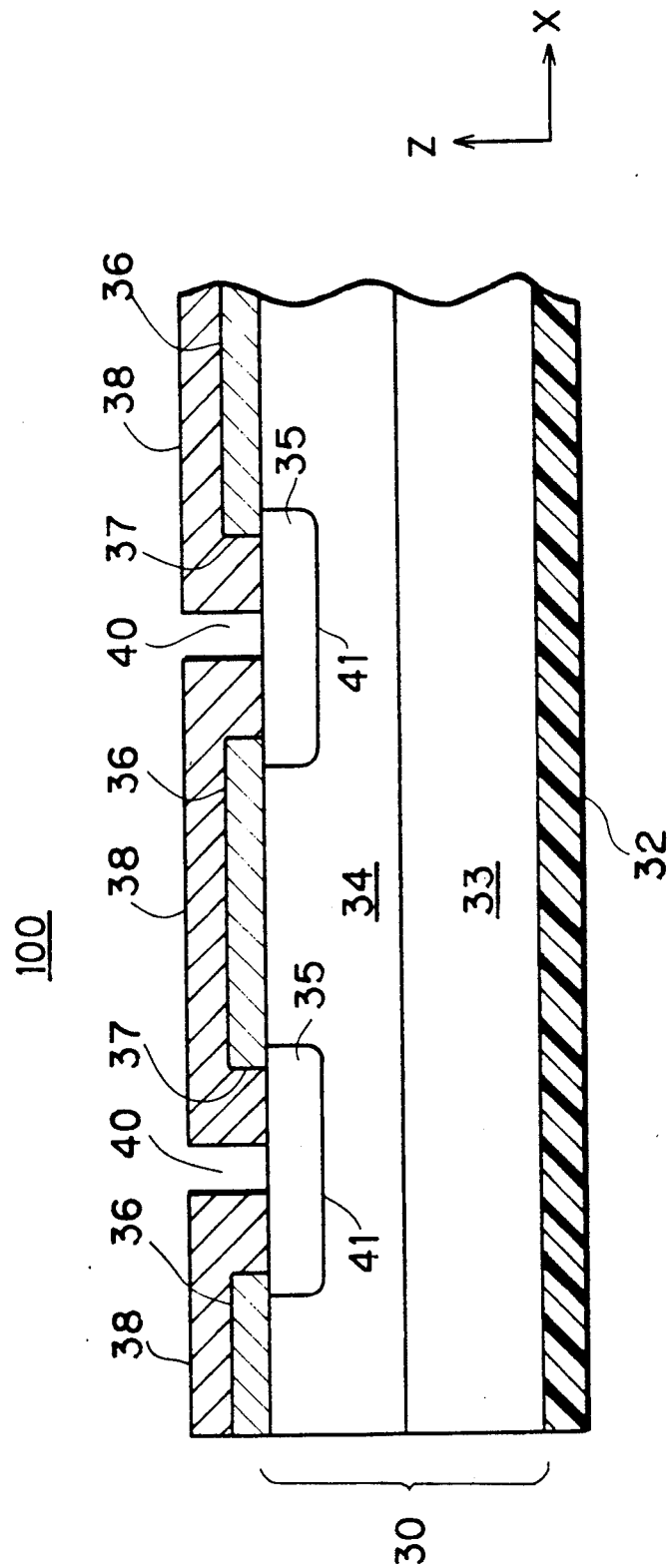

LIGHT EMITTING DIODE ARRAY

BACKGROUND OF THE INVENTION

1. Field of the Invention

The present invention relates to a light emitting diode (LED) array employable in an electronic printer for photography, and particularly to an improvement of light emitting windows in the LED array.

2. Description of Prior Arts

FIG. 1 illustrates the structure of a conventional LED array 1. The LED array 1 comprises a semiconductor body 10 having an N-GaAs layer 3, an N-$Al_xGa_{1-x}As$ layer 4 and P-$Al_xGa_{1-x}As$ regions 5. An N-electrode layer 2 is formed on the bottom surface of the semiconductor body 10, while an insulating layer 8 is provided on the top surface of the semiconductor body 10. The insulating layer 8 has a linear array of rectangular windows 9, which are defined on the P-regions 5. P-electrode layers 11 are formed on the insulating layer 8 and respective end portions thereof are in contact with the top surfaces of the P-regions 5 through the windows 9.

FIG. 2 is a schematic diagram showing the situation in which the LED array is employed in an electronic printer for photography. The LED array 1 is fixed to a base plate 21 such as a printed board, and the electric connection between the LED array 1 and the base plate 21 is attained through die bonding and wire bonding. A self-focus lens array (SLA) 22 is supported by a supporting member (not shown) so that the windows 9 (FIG. 1) face to the SLA 22 across a gap therebetween. A photosensitive drum 23 is rotatably provided and the center axis of the drum 23 is located on a line passing through the LED array 1 and the SLA 22.

An image signal is transmitted to an LED drive circuit (not shown), and in response to the image signal, the LED drive circuit selectively supplies electric power to the LEDs included in the LED array 1 through the electrodes 2 and 11. The LEDs supplied with the electric power generate light L1 at the PN junctions thereof and emit the light L1 through the windows 9. The SLA 22 converts the light L1 into converging light L2, which is applied to the photosensitive surface 24 of the drum 23. The SLA 22 is effective for preventing the light spot from spreading on the photosensitive surface 24 of the drum 23.

Prior to the exposure to the light L2, the photosensitive surface 24 of the drum 23 is electrostatically charged to a negative level. When the light L2 is applied to the photosensitive surface 24, only the part of the surface 24 exposed to the light L2 is discharged. Therefore, a lattent image is obtained on the photosensitive surface 24 by repreating the light generating process while rotating the drum 23 around the axis thereof. Then, the photosensitive surface 24 is supplied with toner charged to a negative level, and the toner stays only on the discharged part of the surface 24 since the toner cannot stay on the non-discharged part due to electrostatic replusive force. The toner staying on the surface 24 is transferred onto a paper, and then, the image thus obtained is fixed by heart and pressure.

The transmission efficiency of light is about several percent in the LED array head consisting of the LED array 1, the base plate 21, the SLA 22 and a driver (not shown). This is because the SLA 22, which has a relatively low transmission efficiency of light, should be provided in the conventional LED array head. Therefore, it has been desired to provide an LED array which can be used at a high transmission efficiency of light.

SUMMARY OF THE INVENTION

According to the presene invention, a light emitting diode array comprises: (a) a semiconductor layer of a first conductivity type: (b) semiconductor regions of a second conductivity type which are selectively formed in a top surface of the semiconductor layer; (c) a first electrode layer formed on a bottom surface of the semiconductor layer: (d) second electrode layers provided on respective first areas in top surfaces of the semiconductor regions; and (e) an opaque layer provided on the semiconductor regions and having through holes which communicate with second areas in the top surfaces of the semiconductor regions, respectively.

Preferably, the light emitting diode array further comprises: (f) an insulating layer provided on the top surface of the semiconductor layer and having windows on the semiconductor regions, respectively.

The present invention is also directed to a method of fabricating a light emitting diode array. According to the present invention, the method comprises the steps of: (a) preparing a semiconductor wafer having a semiconductor layer of a first conductivity type therein; (b) forming a matrix array of semiconductor regions of a second conductivity type in a top Surface of the semiconductor layer (c) forming an insulating layer on the top surface of the semiconductor layer; (d) selectively removing the insulating layer to obtain windows on the semiconductor regions; (e) forming conductive layer on the insulating layer and in the windows; (f) selectively removing the conductive layer to obtain first electrode layers having first portions being in contact with first areas in top surfaces of the semiconductor layers and second portions located on the insulating layer, respectively: (g) forming a opaque layer on the insulating layer, on the first electrode layers and in the windows; (h) selectively removing the opaque layer to obtain through holes in the opaque layer on the semiconductor regions, respectively; (i) forming a second electrode layer on a bottom surface of the semiconductor wafer; and (j) cutting the semiconductor wafer into strips each having a linear array of the semiconductor regions.

Accordingly, an object of the present invention is to provide an LED array usable at a high transmission efficiency of light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a perspective view of an LED array according to a preferred embodiment of the present invention with part broken away for clarity FIG. 4A is a sectional view of the LED array 100 shown in FIG. 3 along line A—A;

DESCRIPTION OF PREFERRED EMBODIMENTS

Figure 4B:
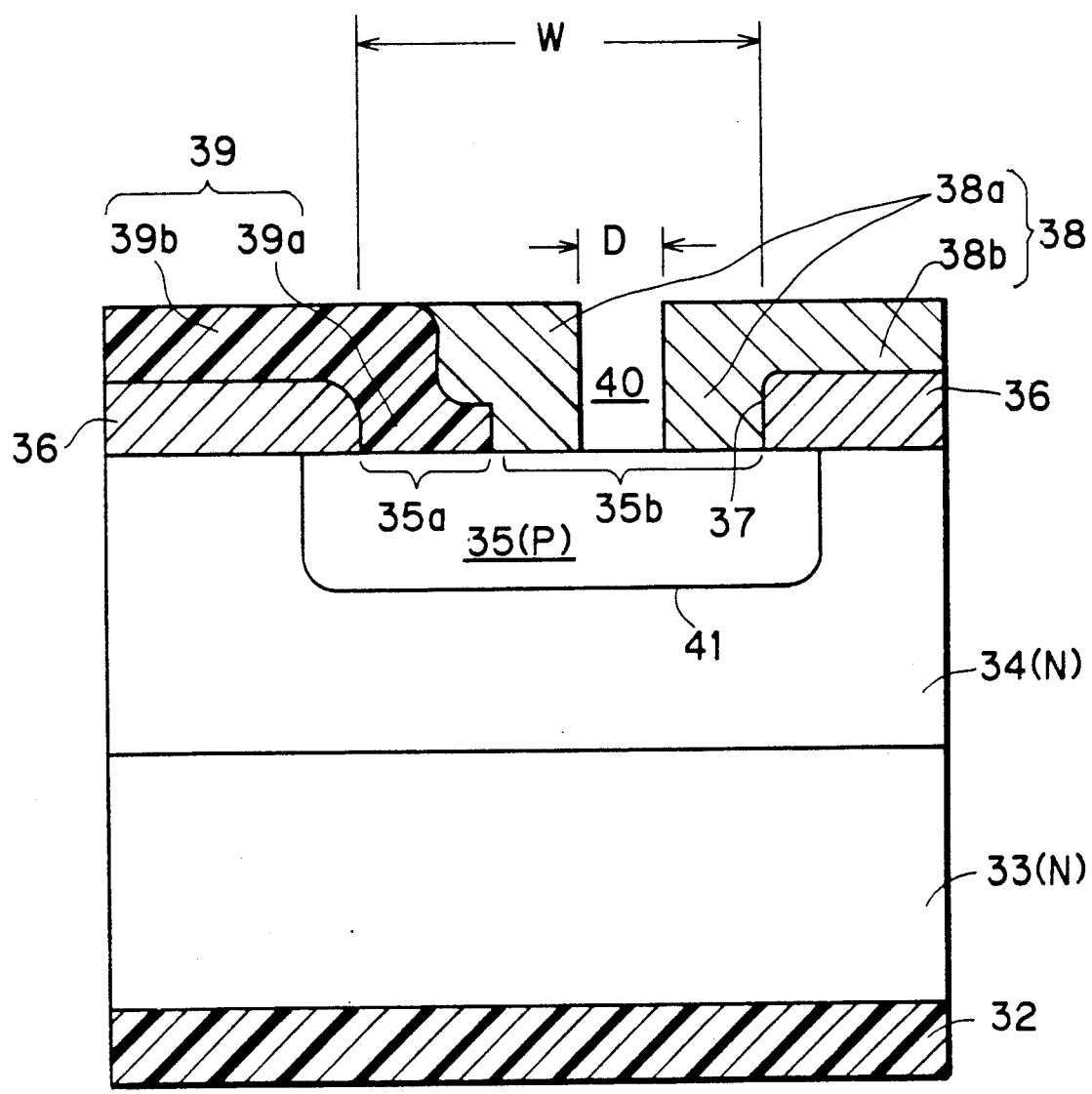
FIG. 4B is an enlarged cross section of the LED array shown in FIG. 3 along line B—B.

Referring to FIG. 3, there is shown an LED array 100 according to a preferred embodiment of the present invention with part broken away for clarity. The LED array 100 comprises a semiconductor body 30 having an N-GaAs buffer layer 33 on which an $N-Al_xGa_{1-x}As$ layer 34 is formed. A linear array of $P-Al_xGa_{1-x}As$ regions or wells 35 are formed along the direction X, as also shown in FIG. 4A, which is a sectional view of the LED array 100 along line B—B. The respective boundaries between the P-layers 35 and the $N-Al_xGa_{1-x}As$ layer are PN junctions 41, which are also aligned in the direction X. An N-electrode layer 32 is formed on the bottom surface of the semiconductor body 30.

On the top surface of the semiconductor body 30, an insulating layer 36 having windows 37 is formed. The windows 37 are provided on the P-layers 35, respectively, and a linear array of P-electrode layers 39 is formed along the array of windows 37. Also referring to FIG. 4B, there is shown an enlarged cross section of the LED array 100 along line A—A in FIG. 3. Each of the P-electrode layers 39 has a first portion 39a being in contact with an area 35a on the corresponding P-region 35 and a second portion 39b provided on the insulating layer 36. Furthermore, an opaque layer 38 is provided on the semiconductor body 30. The opaque layer 38 is made of silicon oxide in which black dye is mixed, and has a first portion 38a filling the window 37 (except for a hole which is described later) and a second portion 38b covering the insulating layer 36. The first portion 38a is in contract with another area 35b on the P-region 35. The top surface of the opaque layer 38 is aligned with respective top surfaces of the electrode portions 39b and is in parallel to the X-Y plane.

In respective second portions 38a of the opague layer 38, through holes 40 communicating with the top surfaces of the P-regions 35 are formed, respectively. Respective windows 37 have a common size W, and the diameter D of each through hole 40 is smaller than the size W of the windows 37. Preferably, the diameter D is smaller than a half (W/2) of the size W and, in the preferred embodiment shown in FIGS. 3, 4A and 4B, the diameter D is about a quarter of the window size W. As will be described later, the diameter D defines the diameter of photobeams emitted from the LED array 100. Accordingly, the diameter D may be determined in accordance with the diameter of photobeams which is required in an apparatus in which the LED array 100 is employed. The through holes are circular holes and extend in the vertical direction Z.

Figure 1:
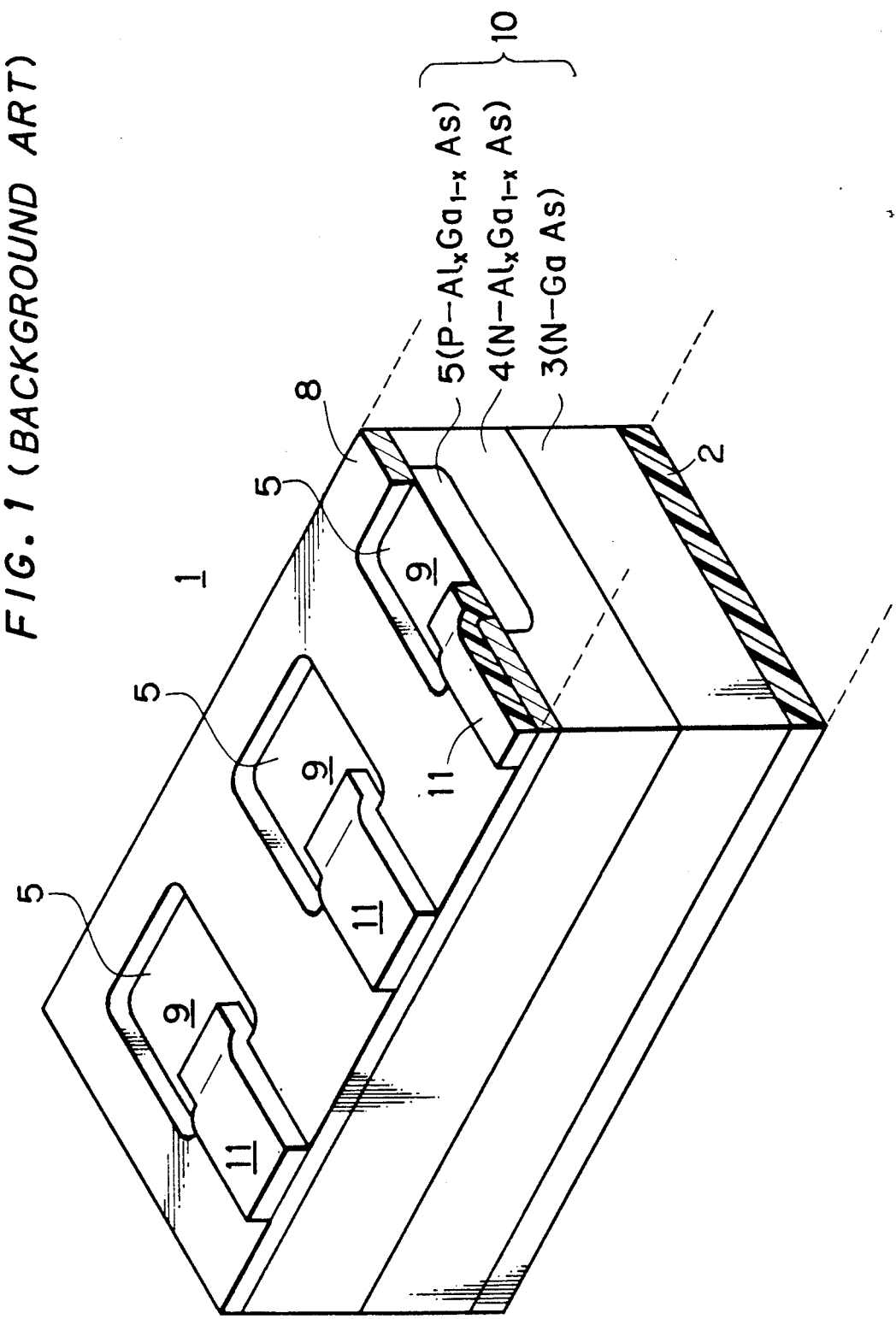
FIG. 1 is a perspective view of a conventional LED array with part broken away for clarity.
Figure 5:
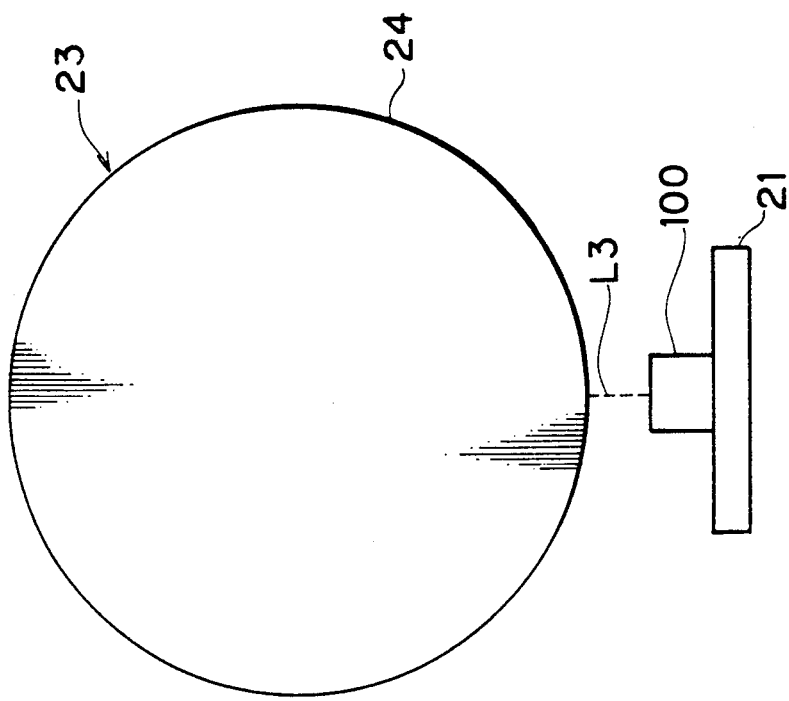
FIG. 5 is a schematic side wiew of an electronic printer for photography in which the LED shown in FIG. 3 is employed.
Figure 2:
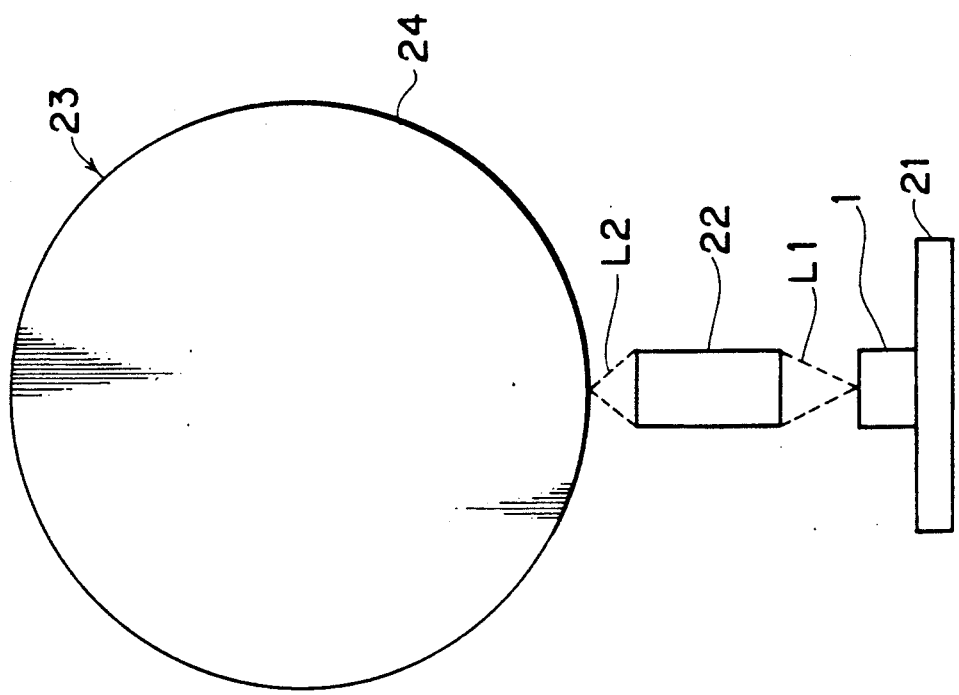
FIG. 2 is schematic side view of a conventional electronic printer for photography in which the LED array shown in FIG. 1 is employed.

FIG. 5 is a schematic side view of an electronic printer for photography in which the LED array 100 is employed. The LED array 100 is mounted on a base plate 21 such as a printed board through die bond and wiring bond. The device thus obtained is so oriented that the openings of the through holes 40 face to the photosensitive surface 24 of a rotatable photosensitive drum 23.

When an image signal is transmitted to a drive circuit (not shown) and the drive circuit selectively applies an electric voltage across the N-electrode layer 32 and the P-electrode layers 39, the LED cells in the LED array 100 selectively generate light at the PN junctions 41 (FIG. 3). The light is selectively blocked by the opaque layer 38 and is emitted through the holes 40 in the form of parallel photobeams L3. The photosensitive surface 24 which is previously charged is selectively exposed to the photobeams L3. A latent image which is obtained on the photosensitive surface 24 by repeating the light-emission process while rotating the drum 23 is transferred to a paper through the same process with the conventional printer.

Since each of the photobeams L3 has a small diameter corresponding to the diameter D of the holes 40, an SLA is not required in the LED array head shown in FIG. 5. As a result, the transmission efficiency of light is improved as compared with the conventional LED array head.

Figure 6A:
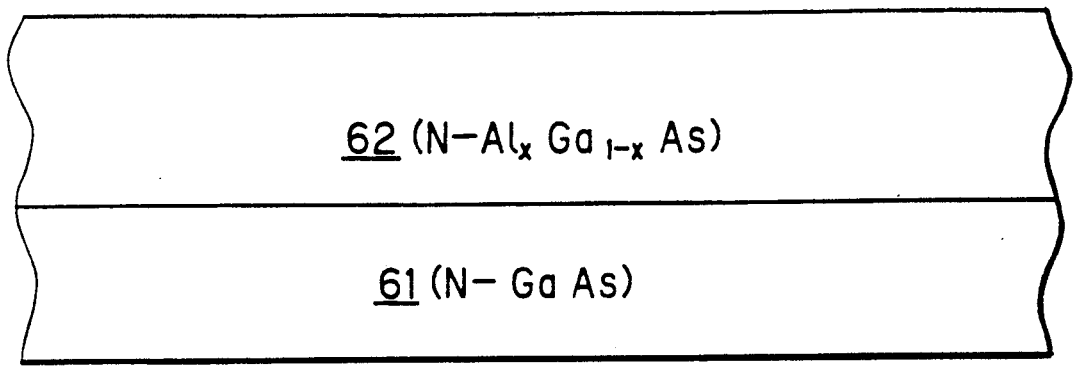
FIGS. 6A through 6H are sectional views showing a process of fabricating the LED array shown in FIG. 3.
Figure 6B:
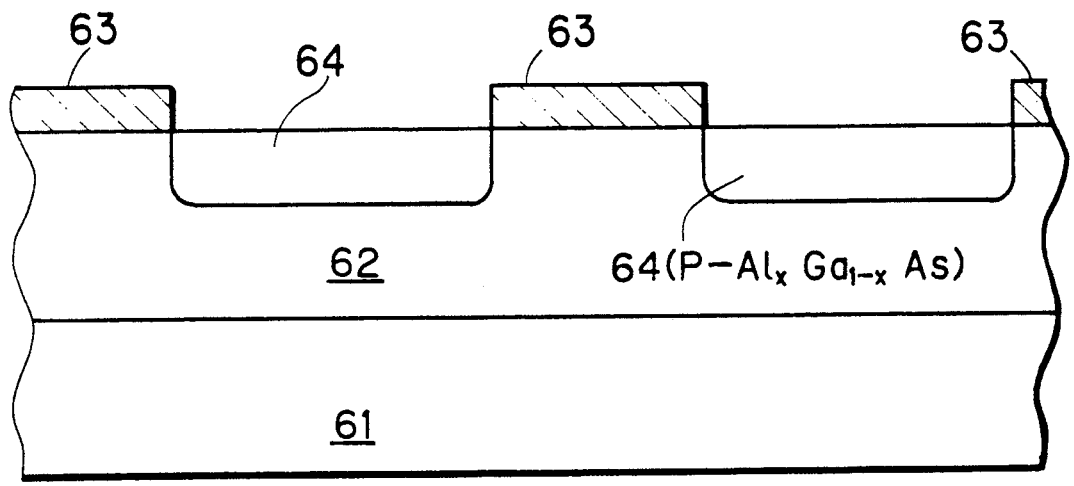

The LED array 100 may be fabricated as follows: First, as shown in FIG. 6A, an N-GaAs substrate or wafer 61 is prepared, and an $N-Al_xGa_{1-x}As$ layer 62 is formed thereon through an expitaxial growth process. Then, a mask layer is formed on the top surface of the layer 62 and is selectively removed through a photolithography process, thereby a mask pattern 63 (FIG. 6B) having a matrix array of windows is obtained. While using the mask pattern 63 as an implantation mask, P-type impurity ions are selectively implanted in the top surface of the layer 62 to thereby obtain a matrix array of $P-Al_xGa_{1-x}As$ regions or wells 64.

Figure 6C:
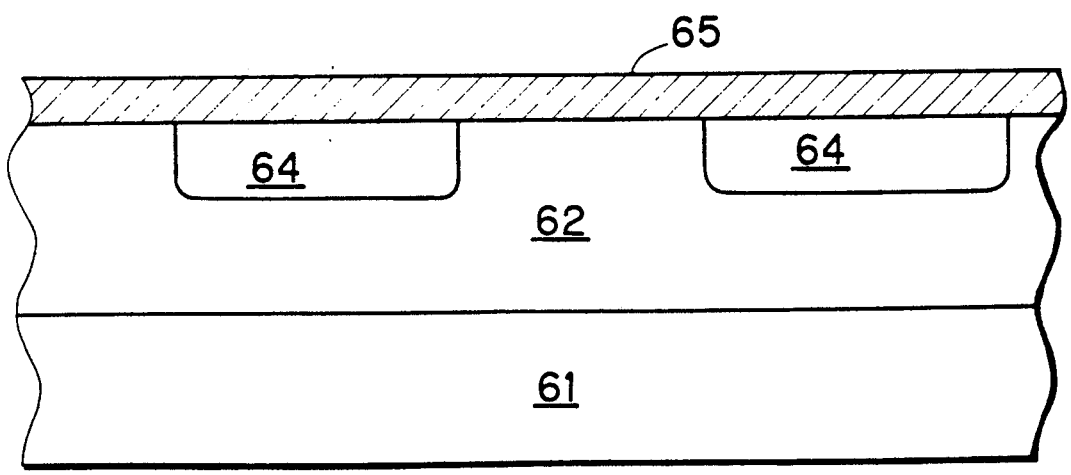
Figure 6D:
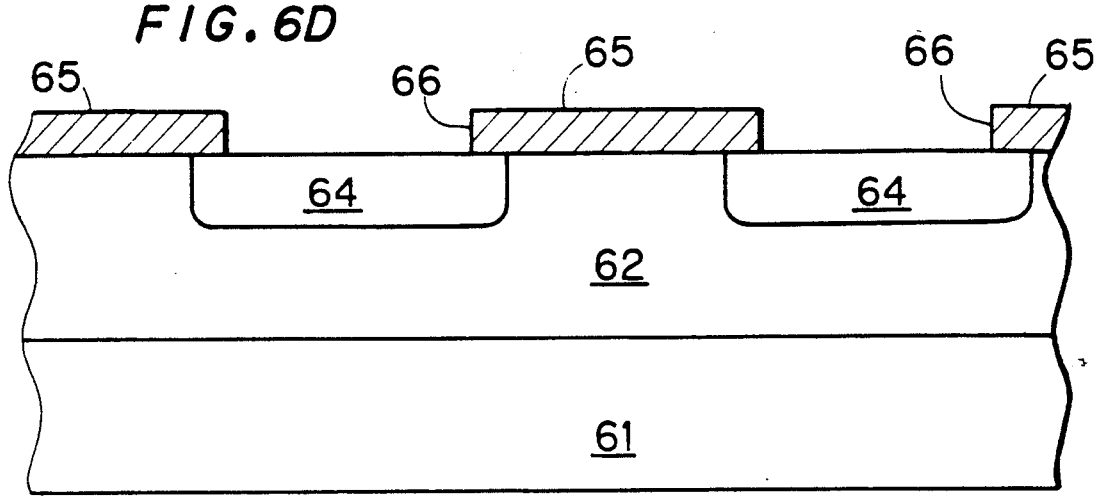
Figure 6E:
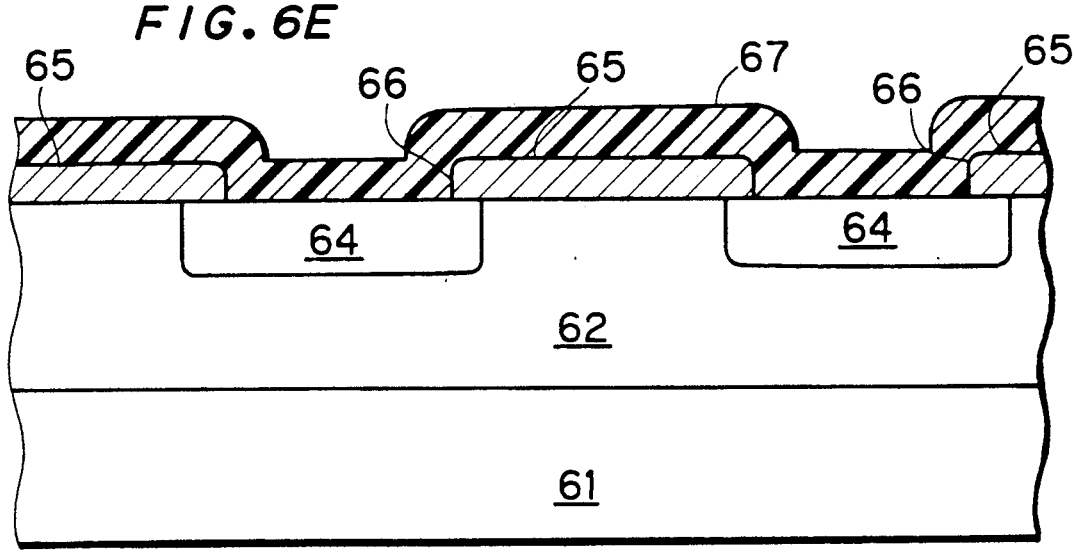

After the mask patten 63 is removed, an insulating layer 65 (FIG. 6C) made of silicon oxide is formed on the top surface of the layers 62 and 64. Then, the insulating layer 65 is removed through a photolithography process to obtain windows 66 (FIG. 6D) on the P-regions 64. An aluminum paste is applied to the whole top surface, and by hardening the same, an aluminum layer 67 (FIG. 6E) is obtained.

Figure 6F:
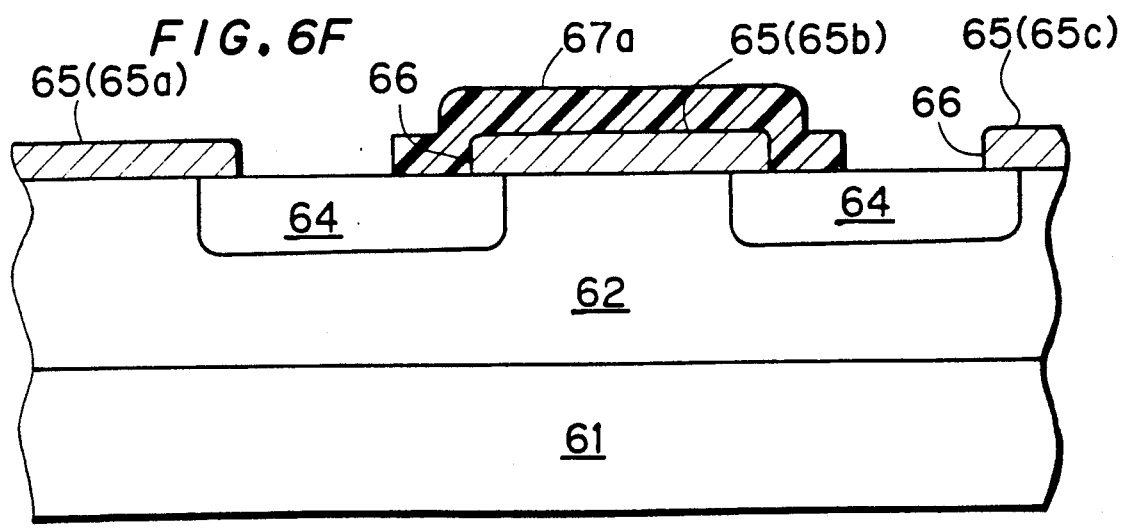

Then, the aluminum layer 6? is selectively removed to obtain aluminum bridges 67a (FIG. 6F) each of which is in contact with two of the P-regions 64 adjacent to each other in the direction Y. The removal of the aluminum layer 67 is an alternate removal in the direction Y, and therefore, the aluminum bridges 67a cover every second portion of the insulating layer 65 in the direction Y. In the example shown in FIG. 6F, the aluminum bridge 67a is located on the portion 65b of the insulating layer 65, but there are no aluminum bridges on the portions 65a and 65c. Since the P-regions 64 are arrayed in a matrix form on the top surface of the N-layer 62, a number of portions each corresponding to the portion are aligned in the direction X perpendicular to the drawing sheet and the aluminum bridges 67a are also aligned in the direction X.

Figure 6G:
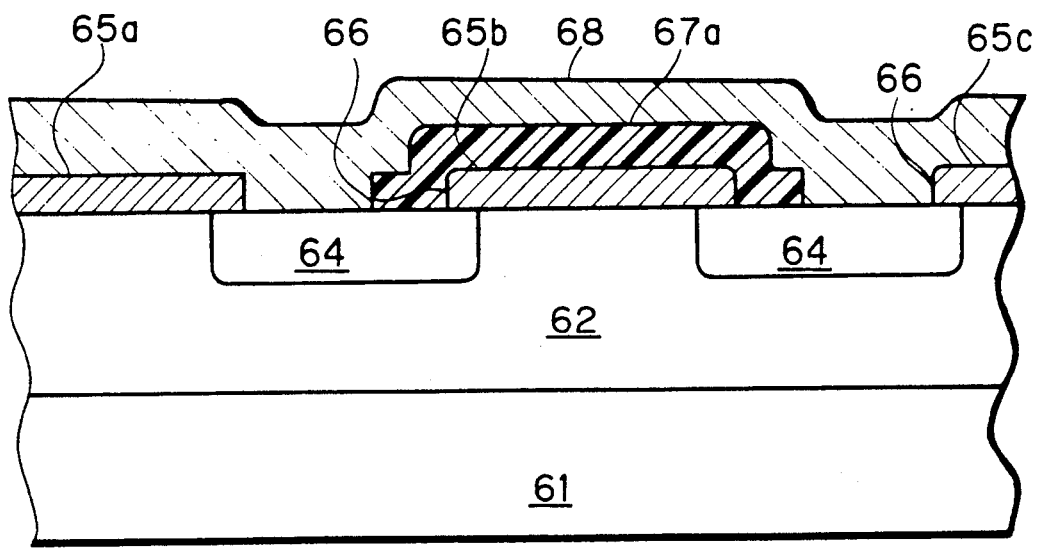
Figure 6H:
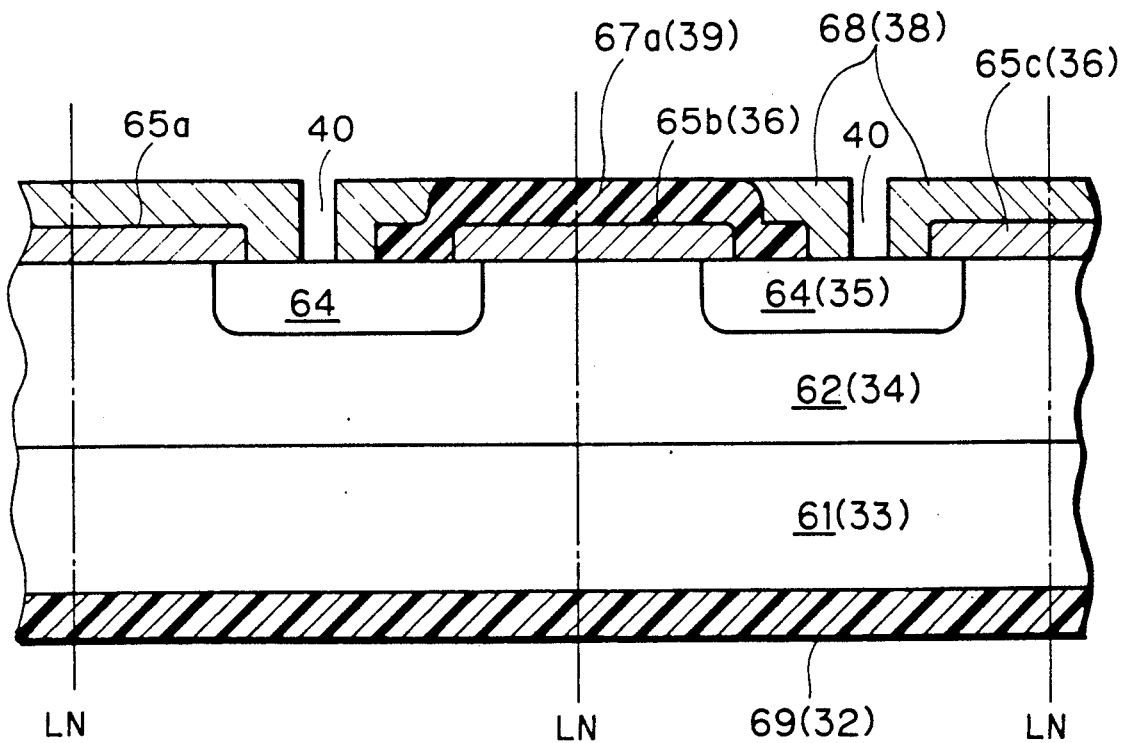

Then, an opaque layer 68 (FIG. 6G) made of silicon oxide and black dye is formed on the respective top surfaces. The top part of the opaque layer 68 is removed through an etching process so that the top surface of the opaque layer 68 is shaped into a plane aligned with the respective top surfaces of the aluminum bridges 67a (FIG. 6H). Through holes 40 communicating with the P-regions 64 are formed through a photolithography process and an aluminum layer 69 is formed on the bottom surface of the Nlayer 61.

The wafer shown in FIG. 6H is then cut into strips along lines LN with a dicing machine, where each of the strips extends in the direction X and has a linear array of LED cells. Each strip thus obtained corresponds to the LED array 100 shown in FIGS. 3, 4A and 4B, where the correspondence between respective layers are shown in FIG. 6H by reference numerals in parenthesis.

Although the aluminum layer 69, i.e., the N-electrode layer 32, is formed after the construction on the top surface in the above-described process, the layer 69 may be formed before the fabrication of the top structure is completed. The opaque layer 3B may be a black glass layer which is coated on the top surface. The present invention can be also applied to a single LED cell having the structure in the section T shown in FIG. 3.

In conclusion, the LED array according to the present invention can be used at a high transmission efficiency of light since the same requires no SLA. In other words, a required intensity of light can be obtained even from a relatively low electric power and the cost in fabricating an LED array head and that in driving the same are decreased.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A light emitting diode array comprising:
    a semiconductor body of a first conductivity type provided with semiconductor regions of a second conductivity type which are selectively formed in a top surface of said semiconductor body;
    an insulating layer provided on said top surface of said semiconductor body and having windows on said semiconductor regions;
    a first electrode layer formed on a bottom surface of said semiconductor body;
    second electrode layers selectively provided on a top surface of said insulating layer and having portions which extend into said windows are in contact with said semiconductor regions; and
    an opaque layer provided on said semiconductor regions and said insulating layer and having through holes which communicate with respective top surfaces of said semiconductor regions;
    wherein a diameter of each of said through holes is smaller than one half of an opening size of said window.

2. The light emitting array from of claim 1, wherein:
    said through holes are circular holes.

3. The light emitting array of claim 2, wherein:
    said through holes are aligned in a direction parallel to said top surface of said semiconductor body.

* * * * *